(12) United States Patent
Yoshioka

(10) Patent No.: US 7,381,905 B2
(45) Date of Patent: Jun. 3, 2008

(54) STRUCTURE FOR FIXING AN ELECTRONIC DEVICE TO A SUBSTRATE

(75) Inventor: Shinichi Yoshioka, Tokyo (JP)

(73) Assignee: Calsonic Kansei Corporation, Tokyo (JP)

( * ) Notice: Subject to any disclaimer, the term of this patent is extended or adjusted under 35 U.S.C. 154(b) by 341 days.

(21) Appl. No.: 11/138,314

(22) Filed: May 27, 2005

(65) Prior Publication Data

US 2005/0263318 A1 Dec. 1, 2005

(30) Foreign Application Priority Data

May 31, 2004 (JP) ............... 2004-160509

(51) Int. Cl.
*H01R 12/04* (2006.01)
*H05K 1/11* (2006.01)

(52) U.S. Cl. ............ 174/262; 174/260; 361/792

(58) Field of Classification Search ........ 174/262–266, 174/260; 361/792–795

See application file for complete search history.

(56) References Cited

U.S. PATENT DOCUMENTS 6,190,941 B1 * 2/2001 Heinz et al. ............... 438/106
6,230,399 B1 * 5/2001 Maheshwari et al. ......... 29/840
6,441,312 B1 * 8/2002 Tanimura et al. ........... 174/252

FOREIGN PATENT DOCUMENTS

JP 2003-318579 A 11/2003

* cited by examiner

*Primary Examiner*—Jeremy C Norris
(74) *Attorney, Agent, or Firm*—Foley & Lardner LLP

(57) ABSTRACT

A structure is disclosed for fixing an electronic device having a heat-releasing plate to a substrate. The structure includes a substrate, a land portion which is formed on a front face of the substrate and on which said heat-releasing plate of the electronic device is to be soldered, a through-hole formed in and penetrating said substrate and said land portion. The through-hole is adapted to release heat generated in the electronic device. The structure further includes a partitioning portion provided to be positioned between the heat-releasing plate and the land portion. The partitioning portion is adapted for preventing a solder, which should partially run out from a specific edge portion of the heat-releasing plate on soldering the heat-releasing plate to the land portion, from partially flowing into the through-hole.

5 Claims, 2 Drawing Sheets

STRUCTURE FOR FIXING AN ELECTRONIC DEVICE TO A SUBSTRATE

BACKGROUND OF THE INVENTION

1. Field of the Invention

The present invention relates to a structure for fixing an electronic device having a heat-releasing plate to a substrate.

2. Related Art Statement

A fitting structure adapted to fixing an electronic device having a heat-releasing plate, e.g., a power transistor, to a substrate is heretofore known (For example, see JP-A 2003-318579 (pages 2 to 3 and FIG. 1).

A front face of the substrate is provided with a land portion to which a heat-releasing plate of the electronic device is to be soldered. A plurality of through-holes is provided to penetrate the substrate and the land portion for promoting release of heat from the electronic device. By this construction, heat generated in the electronic device can be released to the back face side of the substrate through the heat-releasing plate and the through-holes.

When the electronic device is to be fixed to the substrate, the device is arranged on a paste solder preliminarily applied to the land portion such that the heat-releasing plate may contact the solder, and the heat-releasing plate is soldered to the land portion by heating the substrate and temporarily melting the solder.

When the solder is melted in soldering the heat-releasing plate to the land portion, the electronic device descends toward the front face of the substrate due to its self weight. Consequently, the melted solder partially flows into the through-hole(s), the melted solder also partially runs out of an edge portion of the heat-releasing plate. Whether the heat-releasing plate has been well soldered to the land portion or not is judged by checking whether a run-out amount of the solder running out from the specific edge portion of the heat-releasing plate is not less than a prescribed amount or not.

However, the solder, which should have run out from the specific edge portion of the heat-releasing plate on soldering the heat-releasing plate to the land portion, sometimes partially flows into the through-hole(s). Consequently, a run-out amount of the solder from the specific edge portion of the heat-releasing plate is smaller than the prescribed one. Thus, even if the heat-releasing plate is appropriately soldered to the land portion, it may be judged on inspection that the heat-releasing plate is poorly soldered to the land portion.

SUMMARY OF THE INVENTION

It is therefore an object of the present invention to provide a structure for fixing an electronic device to a substrate, which structure can prevent a solder, which should partially run out from a specific edge portion of a heat-releasing plate on soldering the heat-releasing plate to a land portion, from partially flowing into a through-hole.

In order to solve the above problem, the structure for fixing an electronic device having a heat-releasing plate to a substrate according to the present invention, said structure comprising a substrate, a land portion which is formed on a front face of the substrate and on which said heat-releasing plate of the electronic device is to be soldered, a through-hole formed in and penetrating said substrate and said land portion, said through-hole being adapted to release heat generated in said electronic device, and a partitioning portion provided to be positioned between the heat-releasing plate and the land portion, said partitioning portion being adapted for preventing a solder, which should partially run out from a specific edge portion of the heat-releasing plate on soldering the heat-releasing plate to the land portion, from partially flowing into the through-hole.

In the above construction, the partitioning portion is to be positioned between the heat-releasing plate and the land portion for preventing the solder, which should partially run out from a specific edge portion of the heat-releasing plate on soldering the heat-releasing plate to the land portion, from partially flowing into the through-hole. This prevents the phenomenon that a run-out amount of the solder from the specific edge portion of the heat-releasing plate is smaller than the prescribed one on soldering the heat-releasing plate to the land portion as seen in the conventional technique. Thus, a portion of the solder which should run out from the specific edge portion of the heat-releasing plate can assuredly run out. Accordingly, it can assuredly prevent the erroneous judgment that the heat-releasing plate is poorly soldered to the land portion during the inspection as to whether the heat-releasing plate is soldered to the land portion appropriately or not, despite the soldering is appropriately effected.

The partitioning portion can be formed of a solder resist for covering an electroconductive portion of said substrate. In this case, the partitioning portion can be easily formed during working the substrate. The partitioning portion may be formed integrally with the land portion. Alternatively, the partitioning may be integrally formed on a lower face of the heat-releasing plate.

The through-hole can be formed through one side area of said land portion, and the partitioning portion is provided between said one side area of the land portion and the other side area thereof. By this construction, the partitioning portion can more assuredly prevent the solder, which should partially run out from a specific edge portion of the heat-releasing plate on soldering the heat-releasing plate to the land portion, from partially flowing into the through-hole.

The land portion can involve an extension portion extending along an inner peripheral face of said through-hole and a back face of the substrate from said front face of the substrate, and a solder can be filled in the through-hole. By this construction, the heat generated in the electronic device can be more easily released from the back face of the substrate by transmitting the heat of the electronic device to the solder inside the through-hole via the heat-releasing plate. Thus, the heat-releasing effect for the electronic device can be improved.

When the partitioning plate is provided on the land portion and between said one side area of the land portion and the other side area thereof as mentioned above, the solder, which should partially run out from a specific edge portion of the heat-releasing plate on soldering the heat-releasing plate to the land portion, can be prevented from partially flowing into the through-hole. The solder filled inside the through-hole can more assuredly prevent the solder, which should partially run out from a specific edge portion of the heat-releasing plate on soldering the heat-releasing plate to the land portion, from partially flowing into the through-hole.

PRIORITY CLAIM

This application claims the benefit of priority to Japanese Patent Application No. 2004-160509 filed on May 31, 2004, which is incorporated hereinto by reference.

BRIEF DESCRIPTION OF THE DRAWINGS

For a better understanding of the invention, reference is made to the attached drawings, wherein.

DETAILED DESCRIPTION OF THE PREFERRED EMBODIMENT OF THE INVENTION

The present invention will be explained in detail with reference to an embodiment shown in FIGS. 1 and 2.

Figure 1:
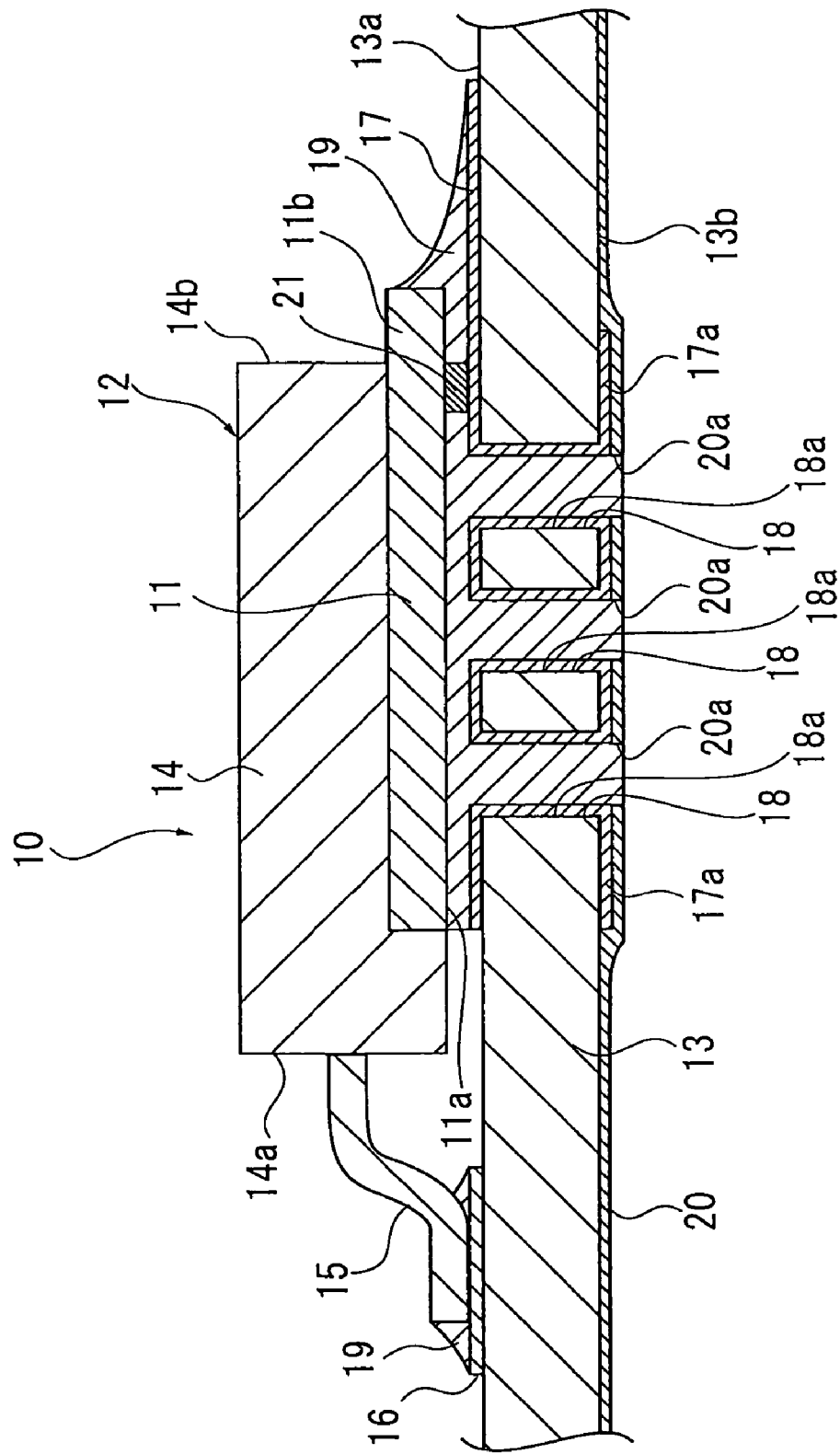
FIG. 1 is a vertically sectional view for schematically showing a structure for fixing an electronic device to a substrate according to the present invention.

As shown in FIG. 1, in a structure 10 for fixing an electronic device to a substrate according to the present invention, the electronic device 12 having a heat-releasing plate 11 is fixed to a front face 13a of a substrate 13.

As the electronic device 12, an electronic device having a heat-generating property, such as an electric field effect transistor or a power transistor, is used in the illustrated embodiment. The electronic device 12 comprises an electronic device body 14, a pair of terminals 15 for electrically connecting the electronic device body 14 to the substrate 13, and the above heat-releasing plate 11 for releasing heat generated in the electronic element body 14.

Figure 2:
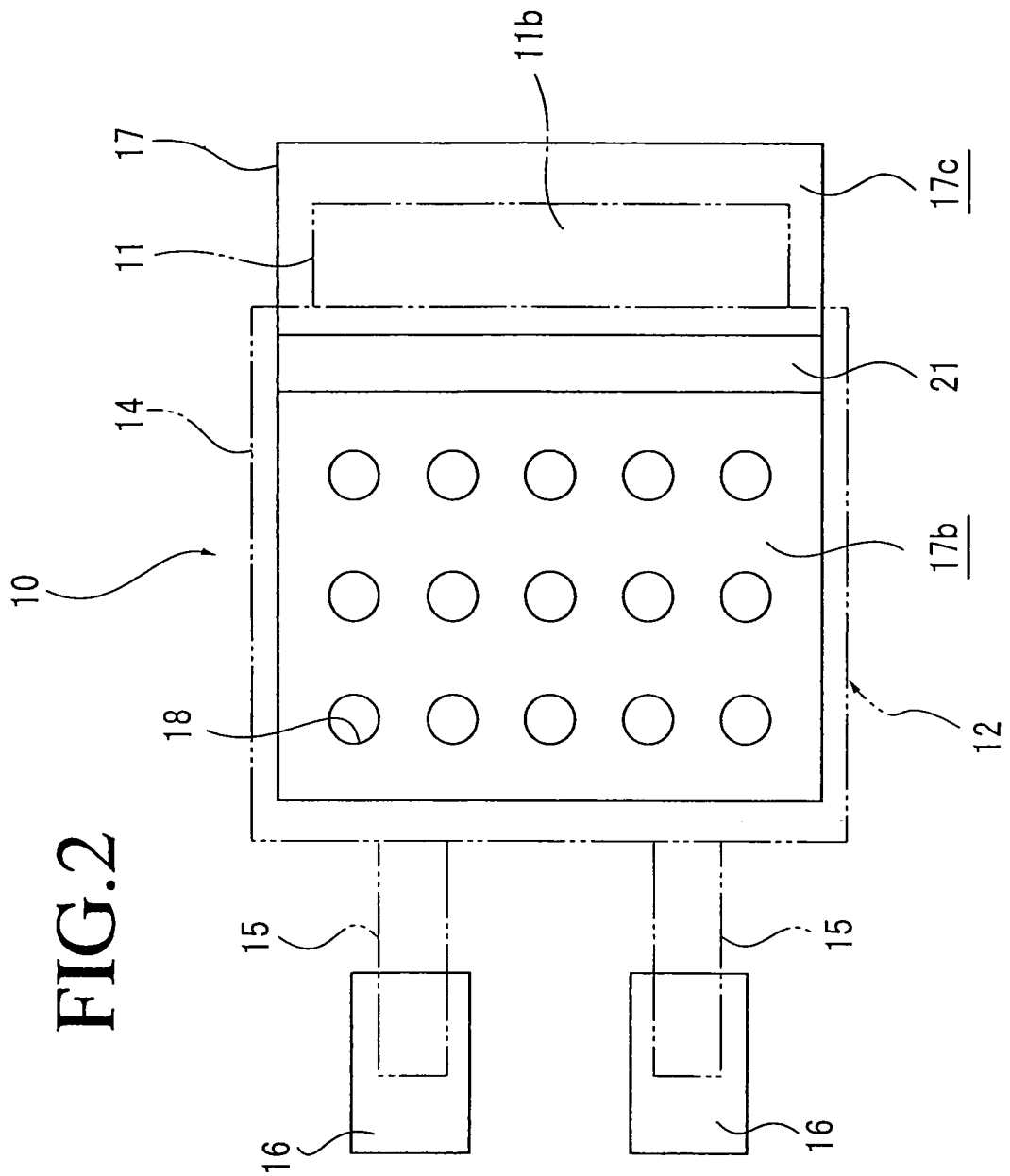
FIG. 2 is a plane view for schematically showing the structure for fixing the electronic device to the substrate according to the present invention.

The terminals 15 are provided such that they extend in parallel from one end face 14a of the electronic device body 14 (See FIG. 2). The heat-releasing plate 11 has a rectangular planar shape in the illustrated embodiment, and is made of a material having a high heat conductivity, such as a metal. The heat-releasing plate 11 is partially buried in the electronic device body 14 such that its lower face 11a is exposed from a lower face of the electronic device body 14 and its edge portion 11b projects from the other end face 14b of the electronic device body 14. The electronic device is soldered to the front face 13a of the substrate 13 via the terminals 15 and the heat-releasing plate 11.

In the illustrated embodiment, the substrate 13 to which the electronic device 12 is fixed is a printed circuit board. As conventionally well known, the printed circuit board has a structure that a printed wiring is provided on a surface of a planar body made of an insulating material by printing with a print ink having a conductivity, for example. Each of the terminals 15 of the electronic device 12 is soldered to the printed wiring 16 formed on the front face 13a of the substrate 13.

A land portion 17 is formed on the front face 13a of the substrate 13, and the heat-releasing plate 11 of the electronic device 12 is to be soldered to the land portion 17. A plurality of through-holes 18 are formed such that they penetrate the land portion 17 and the substrate 13 in their thickness direction.

The land portion 17 has a rectangular planar shape as shown in FIG. 2, and is made of a copper foil. This enables the heat-releasing plate 11 to be soldered to the land portion 17. As shown in FIG. 1, the land portion 17 has an extended portion 17a extending along an inner peripheral face 18 of each of the through-hole 18 and a back face 13b of the substrate 13. The heat-releasing plate 11 of the electronic device 12 is soldered to the land portion 17 such that the edge portion 11b projecting from the other end face 14b of the electronic device body 14 is located in a right-half area 17c of the land portion 17 as seen in FIG. 2. As shown in FIG. 1, a solder 19 runs out of the projecting edge portion 11b of the heat-releasing plate 11 in the state that the heat-releasing plate 11 is soldered to the land portion 17. Whether the heat-releasing plate 11 is well soldered to the land portion 17 or not is judged based on whether a run-out amount of the solder 19 from the projecting edge portion 11b of the heat-releasing plate 11 is not less than a predetermined amount or not when the heat-releasing plate 11 is soldered to the land portion 17.

In the embodiment of FIG. 2, the through-holes 18a are formed and arrayed in a lattice fashion in a left half area 17b of the land portion 17. Solder is filled in each of the through-holes 18. The solder filled in each through-hole 18 is bonded to the extended portion 17a of the land portion extending along the inner peripheral face 18a of the through-hole 18.

As shown in FIG. 1, an insulating film 20 is formed on a side of the back face 13b of the substrate 13 such that the film 20 covers that part of the extended portion 17a of the land portion 17 which extends along the back face 13b of the substrate 13. The insulating film 20 is provided with a plurality of openings 20a in coincidence with the respective through holes 18. In the illustrated embodiment, the insulating film 20 is made of a solder resist. As well known, the solder resist is a covering material having heat resistance for covering the conductive portion so that unnecessary solder may not be attached to the conductive portion on soldering. The formation of the insulating film 20 prevents a portion of the extended portion 17a of the land portion 17 extending along the back face 13b of the substrate 13 from causing electrically inappropriate contact.

A part of heat generated in the electronic device body 14 is released directly to surrounding air from the electronic device body 14 in the same manner as conventionally. A part of the heat generated in the electronic device body 14 is transmitted from the electronic device body 14 to the heat-releasing plate 11 and then from the heat-releasing plate 11 onto a side of the back face 13b of the substrate 13 via the substrate 13. Further, a part of the heat generated in the electronic device body 14 is transmitted from the heat-releasing plate 11 to the solder inside the through-holes 18 and the land portion 17, and is released to the side of the back face 13a of the substrate 13.

As shown in FIGS. 1 and 2, the structure 10 for fixing the electronic device 12 to the substrate 13 according to the present invention is provided with a partitioning portion 21 to be positioned between the heat-releasing plate 11 of the electronic device 12 and the land portion 17. The partitioning portion 21 is provided to prevent solder 19, which should run out from a projecting edge portion 11b of the heat-releasing plate 11 on soldering the heat-releasing plate 11 to the land portion 17, from flowing into the through-holes 18.

The partitioning portion 21 is formed widthwise crossing the land portion 17 between a right half area 17a and a left half area 17b of the land portion 17. In the illustrated embodiment, the partitioning portion 21 is formed of a solder resist, and is provided on forming the insulating film 20 on the back face 13b of the substrate 13.

When the electronic device 12 is to be fixed to the substrate 13, the land portion 17, the insulating film 20 and the through-holes 18 and the partitioning portion 21 are formed for the substrate 13 on which the printed wiring 16 is formed by printing, before the electronic device is placed on the front surface 13a of the substrate 13. Then, paste solder is applied to the land portion 17 and portions of the printed wiring 16 to which the respective terminals 15 of the electronic device 12 are to be soldered. Then, the electronic device 12 is arranged on the front face 13a of the substrate 13 such that the heat-releasing plate 11 and the terminals 15 of the electronic device may be contacted with the solder applied to the land portion 17 and the printed wiring 16, respectively. Thereafter, the solder applied to the land portion 17 and the printed wiring 16 is melted by heating the substrate 13. As the solder is melted, the electronic device 12 descends toward the front face 13a of the substrate 13 owing to its self weight. Consequently, a part of the melted solder on the land portion 17 would be pushed into the through-hole 18, whereas a part of the melted solder runs out from the edge portion 11b of the heat-releasing plate. At that time, as mentioned above, since the partitioning portion 21 is provided between the heat-releasing plate 11 and the land portion 17, the solder in the right-half area 17c of the land portion 17 is prevented from flowing into the left half area 17b in which are provided the through-holes 18. Thus, a given amount of the solder runs out from the projecting edge portion 11b of the heat-releasing plate 11 positioned in the right-half area 17c of the land portion 17, since the solder in the right-half area 17c of the land portion 17 is prevented from flowing into the through-holes 18. That is, the solder runs out from the projecting edge portion 11b of the heat-releasing plate 11 in the given amount which is taken as a criterion to judge whether the heat-releasing plate 11 is well soldered to the land portion 17 or not.

Thereafter, the heat-releasing plate 11 and the terminals are soldered to the land portion 17 and the printed wiring 16, respectively, when the solder is solidified. Thereby, fixing of the electronic device to the substrate 13 is terminated.

According to this embodiment, as mentioned above, the partitioning portion 21 is provided to be positioned between the heat releasing plate 11 and the land portion 17 so that the partitioning portion 21 may prevent the solder, which should partially run out from the edge portion 11b of the heat-releasing plate 11 projecting from the other edge face 14b of the electronic device body 14, on soldering the heat-releasing plate 11 to the land portion 17, from flowing into the through-holes 18. Thereby, since the solder which should run out from the projecting edge portion 11b of the heat-releasing plate 11 can assuredly run out, inappropriate judgment that the soldering is not good can be assuredly prevented on inspection whether the heat-releasing plate 11 is soldered to the land portion 17 appropriately or not.

Furthermore, as mentioned above, since the solder is filled in each of the through-holes 18, heat of the electronic device 12 can be transmitted to the solder inside the through-holes from the heat-releasing plate 11, so that the heat of the electronic device 12 can be easily released from the back face 13b of the substrate 13. Consequently, heat-releasing efficiency for the electronic device 12 can be enhance.

When the solder is filled in each of the through-holes 18, it is feared that unless the partitioning plate 21 is provided between the heat-releasing plate 11 and the land portion 17, the solder 19, which should run out from the projecting edge portion 11b of the heat-releasing plate 11 on soldering the heat-releasing plate 11 to the land portion 17, may flow in the through-holes 19 and at that time the solder filled in the through-holes 18 may pushed out to the side of the back face 13b of the substrate 13 through the through-holes 18.

To the contrary, according to the present invention, as mentioned above, since the partitioning portion 21 is provided between the heat-releasing portion 11 and the land portion 17, the solder which would run out from the projecting edge portion 11b of the heat-releasing plate 11 on soldering the heat-releasing plate 11 to the land portion can be prevented from being flown into the through-holes 18. Thus, the solder filled in the through-holes 18 can be assuredly prevented from being pushed out toward the back face 13b of the substrate 13 through the through-holes 18.

In the present embodiment, the partitioning portion 21 is provided on the land portion between the left-half area 17b and the right-half area 17c, widthwise crossing the land portion. Instead of this, the partitioning portion 21 can be formed surrounding the each of through-holes 18, for example. Alternatively, the partitioning portion can be formed to surround the left-half area 17b of the land portion 17 in which the through-holes 18 are formed.

In the above embodiment, the partitioning portion is made of the solder resist, for example. Instead of this, the partitioning portion 21 can be integrated with the land portion, or the partitioning portion 21 can be integrally formed with the heat-releasing plate 11 at a lower face 11a thereof.

What is claimed is:

1. A structure for fixing an electronic device having a heat-releasing plate to a substrate, said structure, comprising:
    a substrate;
    a land portion which is formed on a front face of the substrate and on which said heat-releasing plate of the electronic device is to be soldered;
    a through-hole formed in and penetrating said substrate and said land portion, said through-hole being adapted to release heat generated in said electronic device, and said through-hole being formed in one side area of said land portion, said electronic device being disposed such that a specific edge portion of the heat-releasing plate is positioned in an other side area of the land portion; and
    a partitioning portion provided to be positioned only between the one side area and the other side area of the land portion and between the heat-releasing plate and the land portion, said partitioning portion being adapted for preventing a solder, which should partially run out from the specific edge portion of the heat-releasing plate on soldering the heat-releasing plate to the land portion, from partially flowing into the through-hole.

2. The electronic device-fixing structure set forth in claim 1, wherein said partitioning portion comprises a solder resist for covering an electroconductive portion of said substrate.

3. The electronic device-fixing structure set forth in claim 1, wherein said land portion comprises an extension portion extending along an inner peripheral face of said through-hole and a back face of the substrate from said front face of the substrate, and a solder is filled in the through-hole.

4. The electronic device-fixing structure set forth in claim 1, wherein the partitioning portion is formed integrally with the land portion.

5. The electronic device-fixing structure set forth in claim 1, wherein the partitioning is integrally formed on a lower face of the heat-releasing plate.

* * * * *